United States Patent [19]

Bakeman, Jr. et al.

[11] Patent Number: 4,506,436
[45] Date of Patent: Mar. 26, 1985

[54] METHOD FOR INCREASING THE RADIATION RESISTANCE OF CHARGE STORAGE SEMICONDUCTOR DEVICES

[75] Inventors: Paul E. Bakeman, Jr., Shelburne; Robert M. Quinn, South Burlington, both of Vt.

[73] Assignee: International Business Machines Corporation, Armonk, N.Y.

[21] Appl. No.: 333,230

[22] Filed: Dec. 21, 1981

[51] Int. Cl.$^3$ .............................................. H01L 27/02
[52] U.S. Cl. ................................... 29/577 C; 29/571; 29/576 B; 148/1.5; 148/181; 357/23.6; 357/48
[58] Field of Search ................ 29/577 C, 576 B, 571, 29/578; 148/1.5, 181; 357/23, 24, 48, 41, 42

[56] References Cited

U.S. PATENT DOCUMENTS

| | | | |
|---|---|---|---|
| 3,653,978 | 4/1972 | Robinson et al. | 148/1.5 |
| 3,852,800 | 12/1974 | Ohwada et al. | 357/24 |
| 3,860,454 | 1/1975 | DeWitt et al. | 148/1.5 |
| 4,004,950 | 1/1977 | Baruch et al. | 148/1.5 |
| 4,115,794 | 9/1978 | De La Moneda | 357/23 |
| 4,176,369 | 11/1979 | Nelson | 357/24 |
| 4,216,489 | 8/1980 | Clemens et al. | 357/41 |
| 4,247,862 | 1/1981 | Klein et al. | 357/48 |

OTHER PUBLICATIONS

A. R. LeBlanc, "One-Device Storage Cell", IBM Technical Disclosure Bulletin, vol. 16, No. 3, Aug. 1973, pp. 956–957.
T. C. May et al., "A New Physical Mechanism for Soft Errors . . . ", 16th Annual Proceedings, Reliability Physics, 4/78, pp. 33–40.
S. Kirkpatrick, "Modeling Diffusion and Collection of Charge . . . ", IEEE Transactions on Electron Devices, vol. ED26, No. 11, pp. 1742–1753.
Kamins et al., "Photosensing Arrays with Improved Spatial . . . ", IEEE Trans. on Electron Devices, vol. ED-25, No. 2, Feb. 1978.
Sai-Halasz, "Soft Error Rate Reduction . . . ", IBM Technical Disc. Bulletin, vol. 24, No. 7A, Dec. 1981.
McNutt, "Buried Channel Charge Transfer Device . . . ", IEEE Trans. Nuclear Science, vol. NS-27, No. 5, Oct. 1980, pp. 1338–1342.
Anolick et al., "Charge-Coupled Device on N-Wafer", IBM Technical Disclosure Bulletin, vol. 23, No. 7A, p. 2894, Dec. 1980.

Primary Examiner—Brian E. Hearn
Assistant Examiner—David A. Hey
Attorney, Agent, or Firm—Howard J. Walter, Jr.

[57] ABSTRACT

A method for reducing the susceptibility of integrated circuit dynamic memory devices to environmentally produced radiation, such as alpha particles, in which a buried layer, having a majority carrier concentration substantially equal to or greater than the concentration of free carriers generated by the radiation and being between one and four orders of magnitude greater concentration than that of the semiconductor substrate, is ion implanted within a few microns of the substrate surface after at least one major high temperature processing step in the manufacturing process has been completed.

11 Claims, 4 Drawing Figures

METHOD FOR INCREASING THE RADIATION RESISTANCE OF CHARGE STORAGE SEMICONDUCTOR DEVICES

FIELD OF THE INVENTION

This invention relates to integrated circuit devices and particularly to manufacturing methods for reducing the sensitivity of charge storage devices to errors caused by transient radiation and other bulk leakage effects.

PRIOR ART

The development of semiconductor memory device technology has, since its successful introduction over a decade ago, made regular and predictable improvements in the areas of reducing costs and increasing performance characteristics. Individual memory devices having data bit densities of 64K (K=1024), 256K and larger bits per chip have been designed. The ability to provide lower cost per data bit of memory has been previously made possible by a continual increase in bits per chip density which has been achieved primarily by decreasing the size of circuit elements. Memory chips having bit capacities in excess of 16K bits per chip have relied almost exclusively on the use of the single device/capacitor memory cell array described in U.S. Pat. No. 3,387,286 to R. H. Dennard. The single-transistor cell and all dynamic memory devices store data in the form of a small charge on a capacitive storage node. In high density memory devices the amount of charge stored may be less than the charge of 300,000 electrons.

However, although dynamic IGFET memory products are known to be sensitive to non-destructive transient radiation effects known to be present in military environments such as are found in a nuclear-weapons blast, see the article, "Digital Logic for Radiation Environments: A Comparison of Metal-Oxide-Semiconductor and Bipolar Technologies", by W. J. Denneky et al, RCA Review, December 1969, pp. 668–699, sensitivity of such products to conventional environments was not believed to be a concern.

May and Woods, in their paper presented at the 16th annual proceedings of reliability physics 1978, pp. 33–40, described a fundamental, error-producing physical mechanism that could provide the ultimate limit in dynamic memory density improvements. They identified environmentally produced alpha particles as a cause of intermittent or "soft" errors in dynamic memory systems. Such errors were previously believed to be caused by system noise, tester errors or other statistically dependent error phenomena.

Alpha particles are emitted during the natural radioactive decay of isotopes of uranium, thorium and other elements found in minute quantities within device packaging materials, as well as materials, such as metals, used to fabricate integrated circuit devices. As emitted alpha particles move through a silicon substrate, energy is lost and electron-hole pairs are generated as free carriers. These free carriers can be collected on oppositely charged circuit nodes seriously degrading voltage levels of binary stored signals. A single alpha particle may have an energy in the range of 2-10 MeV and a range in silicon of 10-70 microns. As many as $2.7 \times 10^6$ (herein such exponentials are expressed as 2.7E6) electron-hole pairs may be generated by a single alpha particle. If the generated carriers are within a diffusion length of a depletion storage region or a capacitive voltage node, they can be collected by the storage element or voltage node and thus change the information state present there, resulting in a soft error. May and Woods point out that a reduction in environmental alpha particle flux of 2-3 orders of magnitude is required to provide soft-error immunity to high density memory devices presently being designed.

Proposed remedies to alpha particle induced soft errors include designing alpha particle immunity into circuits, reducing the amount of radioactive materials present in packaging materials, and the shielding of sensitive device areas with coatings which absorb, but do not emit, alpha particles. Previous evaluations have indicated that device shielding may provide up to a one-order magnitude reduction in failure rates. Reduction of radioactive impurities in various materials used and designing alpha particle insensitivity into circuits can be expected to provide another order of magnitude reduction.

A third area in which significant potential exists for reduction of alpha particle induced soft failures lies in the area of processing and structures of semiconductor devices. Because the IGFET storage devices most sensitive to alpha particle generated free-carriers use localized capacitive storage nodes and the generated free-carriers are quickly thermallized, the effects of alpha particles were initially believed to be equivalent to localized leakage current sources and could be expected to be reduced to some extent by techniques used previously to reduce leakage current in such devices. However, since the generation rate and total quantity of free carriers resulting from alpha particles is a natural event and cannot be controlled, techniques for reducing the life time of the free carriers or for altering their diffusion characteristics in silicon must be used, as opposed to techniques for reducing their generation rate.

For example, it is well known that surface leakage currents can be reduced by the lateral placement of enhanced substrate concentration guard rings between leakage susceptible regions, as taught by U.S. Pat. No. 3,643,139 to Niehuis. Opposite conductivity type surface guard rings, as taught by U.S. Pat. No. 3,798,512 to Critchlow, may also be used to collect minority carrier leakage current. Another processing technique which also aids in the reduction of the effects of leakage current, as well as providing a greater storage capacitance, is that of providing a region of enhanced substrate type impurity immediately adjacent to the storage node, as taught in U.S. Pat. No. 3,852,800 to Ohwada et al Only the last of these techniques has been specifically proposed for protection against alpha particles effects. This technique has the disadvantage of being useful only in connection with storage nodes, since the enhanced impurity concentration cannot be tolerated by low capacitance nodes such as found in bit lines and sensing nodes.

Additional process-related solutions have been proposed which are more specifically related to the alpha particle problem. For example, various processes using epitaxial layers have been proposed. By providing a lightly doped epitaxial layer for active devices over a heavily doped substrate, see Electronics, Mar. 15, 1979, p. 85–86, alpha particle generated carriers formed in the heavily doped substrate tend to recombine more quickly than in the lower doped epitaxial layer, thus reducing their leakage effect. A similar effect is expected to be achieved by the use of a highly doped substrate of the opposite type with respect to the epitaxial layer, see IBM Technical Disclosure Bulletin, January 1980, pp. 3208-3209 by B. J. Masters. Here not only are the free carriers recombined quickly, but they are also attracted to the substrate by the potential gradient of the p-n junction formed between the substrate and the epitaxial layer.

These epitaxial techniques have the disadvantage of being difficult to provide in the required quality and are normally required to be too thick to provide significant attenuation of alpha particle effects, as described below.

Another recombination type structure is taught in the IBM Technical Disclosure Bulletin, February 1980, p. 4106, by K. Brack et al, where a buried recombination layer, formed by disordered crystal structure, is formed by ion implantation. Boron is implanted in n-type substrates or nitrogen is implanted in p-type substrates. A similar effect can also be expected by implanting protons to form a damaged recombination buried layer, see IBM Technical Disclosure Bulletin May 1980, p. 5326 by B. J. Masters. Another technique, described in the IBM Technical Disclosure Bulletin, November 1979, p. 2355 by E. S. Anolick et al, uses an oxygen-rich silicon substrate having a large number of dislocations which has been annealed to provide a two micron thick defect-free surface layer in which active devices are placed. These recombination approaches have the disadvantage of inducing extra thermal carrier generation centers in the substrate which increase diffusion leakage current in surface devices.

Another process variation taught by the prior art is to provide a buried opposite-type collector connected to a surface contact, see IBM Technical Disclosure Bulletin, December 1979, pp. 2689-2690 by H. S. Lee. Here, generated carriers are collected by the buried region and are removed through the surface contact. This technique has the same disadvantage as expitaxial techniques.

A final different prior art process technique, see IBM Technical Disclosure Bulletin, May 1980, pp. 5365-5366, by N. G. Anantha et al, provides a dielectric layer between the substrate and an epitaxial layer. Free carriers generated below the dielectric layer cannot pass into the epitaxial layer because they lack the energy to penetrate the dielectric layer. This technique has all of the disadvantages of other silicon-on-insulator processes.

Klein and Woods in their U.S. Pat. No. 4,247,862, issued Jan. 27, 1981, provide a conceptual description of various epitaxial techniques including many of those described above. Of particular interest is the embodiment shown in their FIG. 2 in which a heavily doped p-type recombination epitaxial layer is formed between an active device-containing epitaxial layer and a lightly doped substrate. The physical characteristics of the layers are: active layer thickness 3 to 10 microns having p-type dopant concentration 1E15 and 1E16 atoms per cubic centimeter (depending upon specific device characteristics desired), barrier layer thickness 1 to 10 microns doped to 1E19 atoms per cubic centimeter and substrate of undefined thickness doped to 1E14 atoms per cubic centimeter. In this structure, the highly doped barrier layer provides a potential barrier which reflects free electrons and also provides a high recombination region for electrons penetrating into the barrier layer. Practical implementation of this structure would require placement of the barrier layer at 8-10 microns below the surface which reduces the efficiency of the barrier to reflect free electrons. The effectiveness of the recombination layer is questionable since the layer would have to be thicker than 40 microns, the room temperature diffusion length of minority carriers in 1E19 doped p-type silicon, to have any effect by recombination. This structure also has a significant processing disadvantage in that it requires the growth of two different epitaxial layers, thus complicating the manufacturing process by the inclusion of additional, and significantly different, processing steps over those of a normal IGFET process. In addition, it is difficult, and thus costly, to provide epitaxial layers of the quality required for IGFET devices. Klein et al. suggests that other techniques such as diffusion or ion implantation and appropriate drive-in steps may be used to form the layers described in their embodiments. However, no specific techniques are disclosed. The simplest of their embodiments, that of their FIG. 5, includes a single active surface layer having a concentration of 1E15 to 1E17 donor atoms per cubic centimeter in a substrate having a concentration of 1E13 to 1E15 donor atoms per cubic centimeter, is preferred to be formed by ion implantation techniques. A process for such a structure can easily be implemented, see for example the article "The Diffusion of Implanted Boron in Silicon", R. P. Ricco et al., Journal Electrochemical Society, February 1977, pp. 276-279, in which a similar surface layer is formed. However, ion-implanted structures having a plurality of layers and doping levels would be extremely difficult and impractical to form. For example, the formation of the embodiment of FIG. 2 of U.S. Pat. No. 4,247,862 requires an active surface layer, a high concentration recombination layer and a high resistivity substrate. Such structures cannot be formed by known ion-implantation techniques. The formation of a buried barrier layer having a region of between one and ten or more microns thickness at a depth of three to ten microns below the surface of a silicon wafer and having a donor concentration of 1E19 atoms per cubic centimeter would require a high implant energy of between 2 and 10 MeV and an extremely long implant time at a reasonable implant current density to provide the required dose of impurity. Such an implanted region would render the entire upper surface layer of the substrate amorphous, which would produce a high number of non-annealable dislocation loops following a required activation annealing step, see the article, "Ion Implantation in Semiconductors-Part II: Damage Production and Annealing", J. F. Gibbons, Proc. IEEE, September 1972, pp. 1062-1097. Such defects would result in excessive thermal leakage current. The use of high energy, high dose ion implantation also causes a substantial non-Gaussian distribution of ions on the surface side of the implanted peak caused by random backscattering by the silicon crystal lattice which cannot be avoided. At the energy and dose levels required, this effect will interfere substantially with surface device characteristics. In addition, the hot processing steps normally used in the manufacturing of IGFET devices would cause a substantial redistribution of the implanted impurity profile such that the concentration level near the surface of the active region would increase even further.

We have discovered that a single ion implantation step may be successfully used to form an effective electrical barrier to free carriers generated within the substrate of a semiconductor device provided it meets certain criteria and is introduced at a particular point during the manufacturing process. The thus produced barrier can be implemented with currently available equipment and does not require doses which produce unannealable damage. Thermal redistribution of impurities is controlled by minimizing the number and extent of hot processing steps which follow the implant step.

The following prior art has been found which is related to high energy ion implantation used to form buried layers having enhanced substrate impurity concentration.

IBM Technical Disclosure Bulletin, August 1973, pp. 956–957 by A. R. LeBlanc, U.S. Pat. No. 3,860,454 to De Witt et al and U.S. Pat. No. 4,115,794 to De La Moneda all teach the ion implantation of substrate-type impurities through a field oxide to form a channel stopper at the interface between the field oxide and the silicon substrate. Regions of the semiconductor surface not covered by field oxide are implanted to a depth which is a function of the field oxide thickness such that isolated buried regions of enhanced concentration are formed below where the active devices are formed. The formation of such buried layers, although potentially capable of acting as a partial reflecting barrier layer, are formed such that the capacitance of active devices is greatly increased as the implanted layer passes directly through the surface diffusions.

U.S. Pat. No. 4,004,950 to Baruch et al teaches a deep ion implant technique in which non-dopant atoms are locally implanted at high temperatures in order to cause a redistribution of previously present dopant atoms resulting in a local increase in dopant concentration, a high recombination rate and a minority carrier repelling field.

Finally, U.S. Pat. No. 4,176,369 to Nelson et al is of interest as it teaches a method of forming charge transfer devices for an image sensor in which a grid of enhanced substrate doping areas are formed as an integral part of the semiconductor device to deflect light stimulated free minority carriers toward adjacent diode-type carrier collection regions. The preferred method of forming these regions is said to be by ion implantation, although the process parameters specified provide a structure different than that shown or described.

In summary, although various ion implantation and epitaxial techniques have been previously described which could have some influence on the reduction of alpha particle generated soft errors in dynamic memory devices, no practical method is known for providing a significant reduction in soft-errors which does not have serious drawbacks either in the ease of implementation or in the effects on electrical characteristics of devices manufactured.

SUMMARY OF THE INVENTION

The instant invention overcomes the problems of the prior art by providing through a single ion implantation step a structure which provides up to a 40:1 reduction in the soft-error rate of dynamic memory devices exposed to alpha particle radiation. The method of the invention includes the high energy implantation of impurities of the same type as those of the substrate at a depth below the maximum depletion depth produced by surface structures such that a built-in potential barrier to diffusing electrons exists by virtue of a concentration gradient of up to 3 or 4 orders of magnitude greater than that of the substrate doping level. The ion implantation step is performed after at least one high temperature processing step has been completed, but prior to the completion of active surface devices, in order to provide an adequately isolated buried layer having minimal effect on the electrical characteristics of the active surface devices. The method may be easily implemented on pre-existing memory circuit designs in which alpha particle sensitivity has not previously been considered. When additionally known alpha particle soft-error reduction techniques are utilized in conjunction with the method of the invention, reduction of soft-error rates on the order of three orders of magnitude may be achieved, thus enabling the continued densification of memory products.

The invention is more specifically described in terms of the preferred embodiments, as illustrated in the accompanying drawings.

DESCRIPTION OF THE PREFERRED EMBODIMENT

Figure 1:
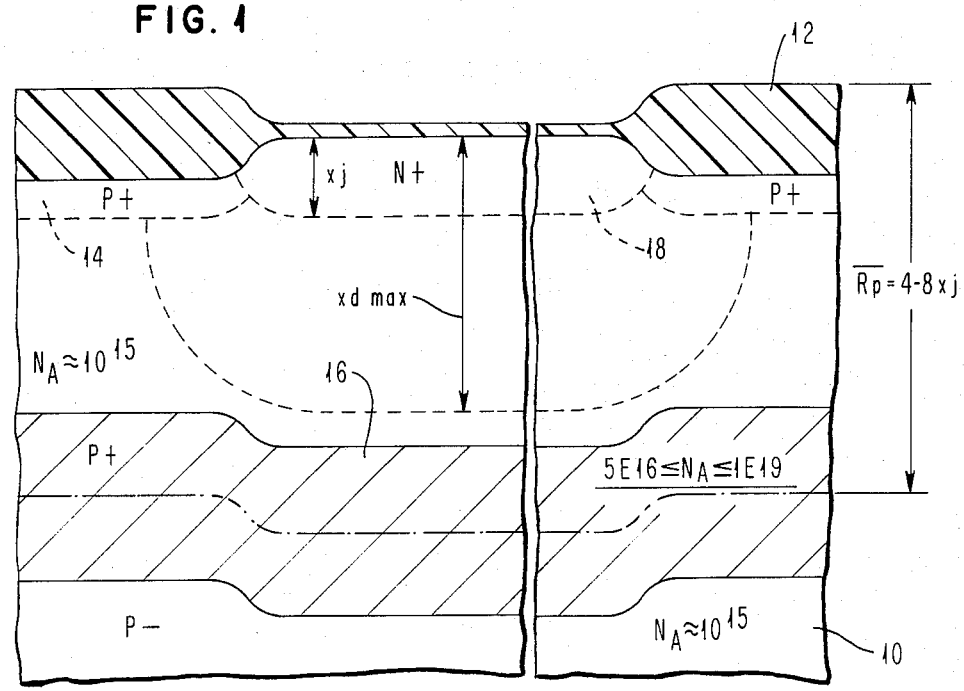
FIG. 1 is a schematic sectional view of a partially fabricated semiconductor integrated circuit memory device showing the relationship between the buried implanted region and the recessed field oxide layer.

As described above, it has been demonstrated that the presence of radiation in the form of emitted alpha particles can cause the failure of high density dynamic memory or other semiconductor products using charge storage. Alpha particles are a natural form of radiation consisting of doubly ionized Helium ions having an energy of between 2 and 10 MeV and a penetration depth in silicon of between 10 and 70 microns. As described by Kirkpatrick, IEEE Tr. Electron Devices, November 1979, pp. 1742–1753, the energy lost by an alpha particle creates high energy electron-hole pairs within about 0.1 nanometers of the particle track. The density of alpha particle generated electron-hole pairs increases by a factor of two to three times as the particle comes to rest, reaching a maximum of about 1E5 pairs per micron at the end of its track. Thermallization of the electron-hole pairs occurs in only a few picoseconds leaving an average of about 5E4 electron-hole pairs per micron of track length. Thus, in p-type silicon substrates employed for n-channel FET structures, in excess of 1E6 free minority carriers, electrons, are generated by a single alpha particle. In such substrates, the diffusion length of minority carriers before recombination may be as great as a few millimeters, such that all of the excess free electrons will diffuse to surface regions and be collected by storage node depletion regions before they recombine. It is the collection of these free electrons by surface depletion regions which causes soft errors.

Although both Kirkpatrick and Klein et al propose the use of a sub-surface recombination layer placed 3 to 10 microns below the substrate surface for the purpose of providing virtually 100% absorption of free electrons generated within the recombination layer, such layers in practice are very much less efficient and require degenerate doping concentrations on the order of more than 1E19 atoms per cubic centimeter. Although such highly doped layers may be formed by epitaxial techniques, as previously described, the characteristics of these layers, particularly after experiencing high temperature processing steps used to fabricate devices, is such that practical depths of about 10 microns are required to prevent the out diffusion of dopant in the high concentration layer from causing a serious impact on surface device characteristics. At such required depths, the number of alpha particle generated free electrons prevented from reaching the surface is minimal as indicated by Kirkpatrick, particularly for alpha particles striking the surface at an angle. Such buried recombination layers are virtually impossible to fabricate by other techniques, such as by ion implantation since the out-diffusion effect is emphasized by the initial non-Gaussian implant concentration profile of the ion implanted species.

In addition, crystalline damage caused to the overlying surface layer by ion implant doses required for forming recombination layer degenerate concentrations can cause serious thermal leakage problems.

We have discovered that a significant reduction in the soft error rates caused by alpha particle generated free carriers can be achieved by providing a built-in field in response to a relatively small increase in the substrate doping concentration at a depth of only a few times the depth of surface junctions. Such an enhanced concentration region is best provided by a dose of implanted ions at a level which does not produce non-annealable damage in order to maintain the integrity of the crystalline substrate surface required for good device characteristics.

Several criteria must be met by the implanted layer.

First, because the majority of excess free carriers are generated and thermallized near the end of an alpha particle track, these free carriers act as instantaneously generated leakage current. The movement of free carriers released deep in a typical semiconductor substrate is primarily by diffusion only, since the substrate is substantially field free. Consider a non-degenerately doped semiconductor, maximum doping limited to less than 1E19, at equilibrium conditions and at room temperature, 300° K. A potential barrier will exist between two adjacent regions of different concentration that is approximately equal to $KT/q \ln(Np/Nb)$, where $KT/q$ equals 0.026 volts, $Np$ equals the concentration of the higher doped region and $Nb$ equals the concentration of the lower doped region or bulk. A potential barrier, $Eb$, equal to 0.060 volts per order of magnitude difference in concentration will exist. The number of thermallized electrons, $Ne$, having an energy greater than the barrier height is given by the Fermi-Dirac distribution for the total electrons, $No$, reaching the barrier as $Ne/No = \exp(qEb/KT)$. Thus, about 10 percent of the thermallized electrons will pass over a 0.060 volt barrier while only about 1% will pass over a 0.120 volt barrier, corresponding to a two order increase in doping concentration over that of the bulk. Note that if the doping level of the high concentration region is equal or greater than 1E19, regardless of the bulk concentration, a maximum barrier of about 0.180 volts will be reached.

However, merely providing a potential barrier with a buried or surface layer having an increasing dopant concentration in the direction of the surface, is not sufficient to prevent large numbers of free minority carriers, electrons in p-type material, from reaching surface devices. Consider the surface barrier described in FIG. 5 of U.S. Pat. No. 4,247,862. Here a two micron thick active device p layer having an acceptor concentration of 1E15 to 1E17 is formed on a p-substrate having an acceptor concentration of 1E13 to 1E15. Using an active surface layer having an acceptor concentration of 1E15, typically used for VLSI MOSFET memory devices and an acceptor concentration of 1E13 in the substrate will provide a 0.120 volt potential barrier but has the following problems. First, the substrate resistivity will be about 1000 ohm-cm and will be virtually useless as an active substrate electrode for surface devices because of its high resistance and accompanying substrate current generated potential gradients, should the substrate be negatively biased. Second, the diffusion component of substrate leakage, due to the two-order increase in magnitude of free minority carriers, would prevent high temperature operation of dynamic storage devices on the surface due to a corresponding two-order magnitude increase in leakage current. Third, but more significant is the effect of an alpha particle striking such a structure.

As indicated by Kirkpatrick, above, as an alpha particle passes through silicon it creates from 3E4 to 1E5 free carriers per micron of track length. Thus, within a few picoseconds a cloud of excess free carriers is created, which extends from the surface into the substrate, a distance depending upon the energy of the particle. The density of the free carriers is reduced with time by diffusion and after, for example about 0.1 nanoseconds, the cloud of free carriers will have expanded by diffusion such that the per unit volume concentration is about 3E4 to 1E5 injected carriers per cubic micron. The density of acceptors, $Na$, originally present in the surface layer is only 1E3 per cubic micron. In other words, the number of excess free carriers generated is about 100 times greater than the number of ionized acceptors initially present in the silicon. Should the alpha particle pass through a surface device structure supporting a depletion region, the free carriers formed in the depletion region will immediately be subject to the strong field in the depletion region such that the free electrons will be swept to the surface while the free holes, representing an equal positive charge, will be swept toward the bulk. This positive charge locally raises the potential in the substrate adjacent to the edge of the initial depletion region and creates a drift field beneath the depletion region which attracts additional excess electrons toward the surface where they are collected. The cloud of electrons flowing to the surface allows the surface potential to be momentarily extended through the depletion region and into the substrate until the majority carrier concentration is again predominent, eliminating the drift field. Thus the internal field acts as a funnel which directs substantially all of the excess free minority carriers to a depth of several microns to a single depletion region, as opposed to allowing the excess carriers to diffuse to several different depletion regions.

A similar effect occurs if a 10 micron thick p-type epitaxial layer is provided on a p+ substrate doped as a recombination region. Virtually all of the free carriers along the alpha particle path in the epitaxial layer will be collected on a single storage node within about one nanosecond after impact. The remainder of the free minority carriers formed below the epitaxial layer, less those that recombine, will be transported to surface nodes by diffusion only.

The funnelling effect can be quickly terminated if the equilibrium bound negative charge in the substrate, due the substantially complete ionization of acceptor impurity atoms, is equal to or greater than that represented by the excess majority carrier, or hole, density moving away from the surface of the substrate. Thus, the acceptor concentration beneath depletion regions should exceed that of the excess free carriers generated by the alpha particle. Since a single alpha particle generates an average of about 5E4 excess free carriers per square micron, the average substrate majority doping concentration, Na, should be equal or greater than 5E4 per cubic micron, or 5E16 per cubic centimeter. A preferred range is between 5E16 and 1E19. The upper limit is chosen to avoid the problems associated with the formation of a degenerate semiconductor region. The substrate should also include a potential barrier to thermal carriers including a lower doping level up to three orders of magnitude less than that of the overlying layers, in order to provide an adequate potential barrier for free minority carriers which are generated deep within the substrate and are transported by diffusion only.

A third consideration in providing an enhanced concentration barrier to alpha particle generated free carriers is the location of the field reducing region and potential barrier with respect to active devices. In integrated circuits designed to operate in silicon having a doping concentration Na, of about 1E15/cc, a surface layer concentration of 5E16/cc would be unsuitable. Therefore, a buried enhanced concentration layer is preferred. Since conventional epitaxial layers have the disadvantage of having high defect levels and must be formed prior to any device processing, ion implantation is preferred.

The use of high energy ion implantation is preferred, as it has the advantage that a single ion implantation step can be used to provide a buried potential barrier and a field stopping layer having a reasonably well confined concentration profile. Performing the ion implantation after completion of one or more major hot processing steps such as field oxide formation or junction drive-in steps has the added advantage of restricting the post-implant out-diffusion of the implanted ions to a minimum. Hot processing steps such as oxidation and diffusion are usually carried out at temperatures in excess of 500° C. and depending upon their duration can cause substantial redistribution of implanted ions. Although no hot steps, except an activation annealing step following ion implantation, are required to implement the invention, several hot processing steps are usually used. The depth or range of an implanted barrier is chosen on the basis that maximum protection will be obtained when the barrier is closest to the surface of the substrate. However, minimal impact on the electrical characteristics of active devices is also an objective.

Therefore, the preferred implementation of a buried alpha particle barrier for p-type substrates will include providing a final concentration, Na, of acceptor doping atoms of at least 5E16/cc in a substrate having a concentration about one or two orders of magnitude less acceptor atom concentration. The barrier should be ion implanted, after at least one of the major hot processing steps is completed, at a minimum depth selected such that the final concentration profile has no significant effect on the normal electrical characteristics of devices formed in the surface of the substrate.

The following paragraphs describe examples of the application of the invention to two different IGFET processes.

This preferred embodiment of the invention is described in connection with a particular process for providing self-aligned polysilicon gate IGFET devices. FIG. 1 illustrates a portion of a semiconductor wafer partially fabricated by this process. Generally, a boron doped silicon wafer 10, having an initial background doping concentration of about 1E15Na/cc and having its major surfaces parallel to the 100 crystalline plane, is provided with a thin thermal silicon dioxide layer of about 200 to 800 A followed by the deposition of a layer of oxidation inhibiting silicon nitride having a thickness of about 500 to 1,000 A. This composite layer is patterned photolithographically to define a plurality of patterned silicon nitride areas. Next a semi-recessed field oxide 12 is thermally grown in unprotected areas of the surface of wafer 10 to a thickness of about 3,000 to 10,000 A. This oxide 12 is grown by a relatively high temperature process at 800° to 1200° C. for a period of about 2 to 10 hours. A field threshold voltage tailoring step may be performed prior to the growth of oxide 12 by ion implanting boron at 40 to 250 KeV and a dosage of about 1 to 5E13 ions per square centimeter. During the growth of oxide 12 boron diffuses faster than the surface of wafer 10 oxidizes to provide a p+ channel stopper 14 under oxide 12. After growth of field oxide 12 the wafer is treated by buffered hydrofluoric acid to remove oxidized silicon nitride followed by a hot phosphoric acid etchant to remove the silicon nitride patterns.

Figure 2:
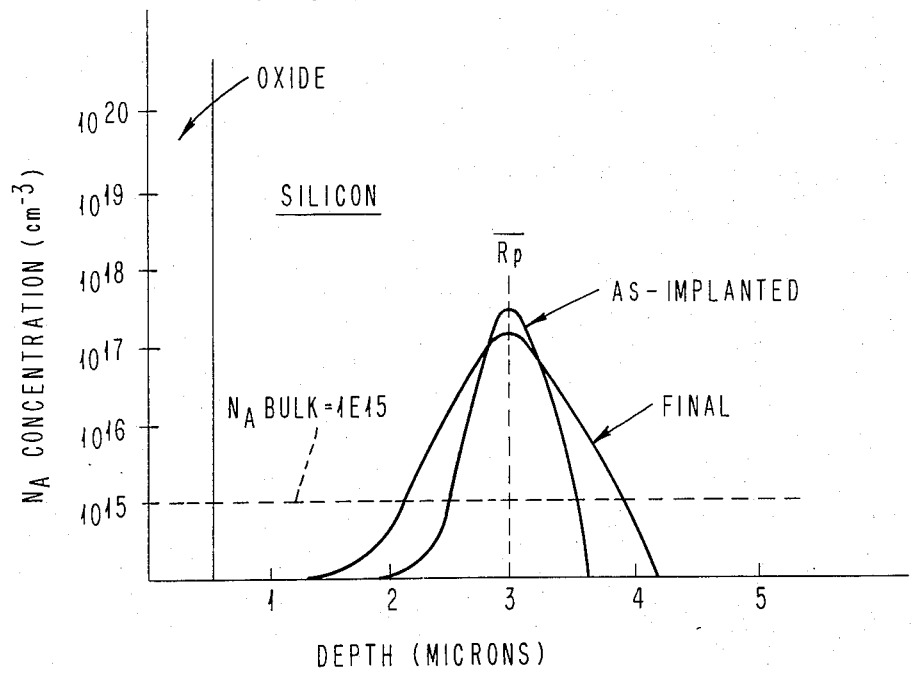
FIG. 2 is a graphical representation of the acceptor dopant impurity concentration profile in the semiconductor substrate of FIG. 1, immediately after implantation and after final processing.

Next, according to the invention, a high energy ion implantation step is carried out to provide a buried region 16 of enhanced substrate impurity type deep within silicon wafer 10 to provide an impurity concentration source which after final processing of semiconductor devices on the surface of the wafer 10 will provide the required characteristics of the buried alpha particle barrier of the invention. This is accomplished by ion implanting boron ions at an energy of about 2 MeV and a dose of 8E12 ions/square centimeter. The resulting concentration profile is shown in FIG. 2 as the as-implanted concentration profile. The resulting range is about 3.0 microns and the peak boron concentration is about 2E17/cc.

Following the implantation, device processing is continued in a manner such as described in copending U.S. patent application Ser. No. 214,940 filed Dec. 10, 1980, now U.S. Pat. No. 4,329,773, in which self-aligned polysilicon gate devices are provided. Surface diffused n+ regions 18, as shown in FIG. 1 are formed by an ion implantation pre-deposition of arsenic followed by a thermal oxidation and drive-in step to provide a final junction depth Xj of about 0.5 microns. The processing steps used to fabricate the IFGET structures cause the implanted boron to diffuse somewhat and results in a final concentration profile shown in FIG. 2 in which the maximum concentration has dropped to about 1E17/cc and the intersection of the implanted region with that of the background concentration has moved to within about 2.1 microns of the surface of substrate 10., just beyond the maximum depletion depth Xd anticipated during operation of the devices formed on the surface. The final concentration profile provides an adequate thickness, about one micron, at an average concentration greater than the minimum of about 5E16 to reduce the previously described funneling effect to a minimum.

Figure 3:
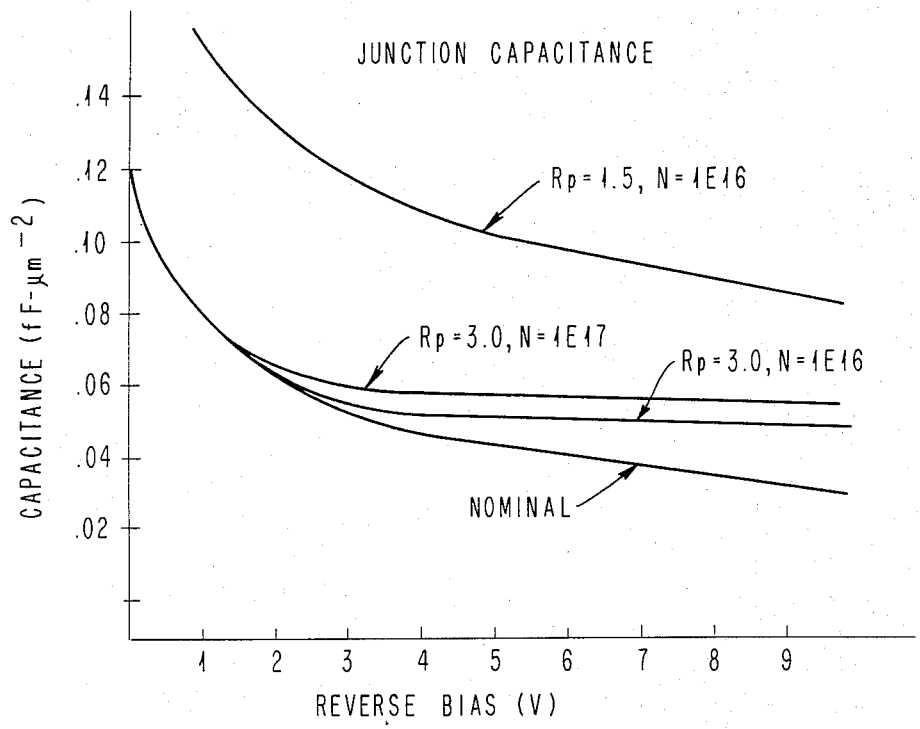
FIG. 3 is a graphical representation of the effect of various ion implantation energies and doses on the junction capacitance of diffused surface junctions.

FIG. 3 shows the calculated effect of three different ion implanted barrier layers on p/n junction capacitance. Note that a significant increase in junction area capacitance results if the implantation range is only 1.5 microns due to the interference between the junction depletion region and the enhanced concentration of the implanted barrier. At a range of 3.0 microns, with maximum concentrations of 1E16 and 1E17/cc, the influence is considerably less.

Figure 4:
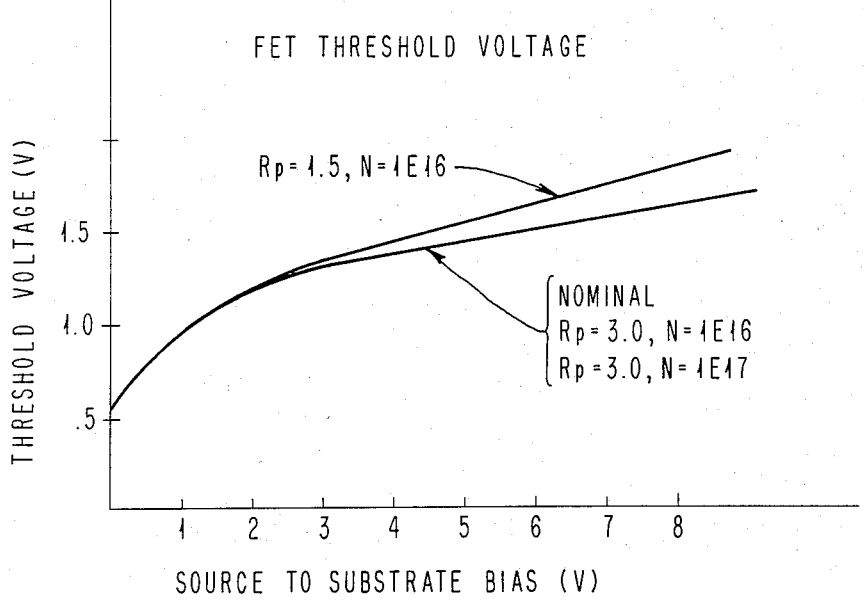
FIG. 4 is a graphical representation of the effect of various ion implantation energies and doses on the threshold voltage of IGFET devices formed on the surface of the substrate.

FIG. 4 shows the calculated effect on IGFET device threshold voltage for the same implantation conditions as used in FIG. 3. No effects on device threshold voltages and related characteristics can be expected when the range of 3.0 microns is used at the indicated doses.

Thus, the buried barrier layer is, as intended, substantially deeper than the region of electrical activity of devices formed on the surface of the substrate, since it has little effect on the electrical characteristics of the devices.

In order to demonstrate the practical feasibility of the ion implanted alpha particle barrier of the invention, it was implemented on an existing 64K bit dynamic memory product which had been demonstrated to have a susceptability to alpha particle induced soft errors. The fabrication process differs substantially from that described above, as it employs a polysilicon field shield in place of the semi-recessed oxide as a surface isolation structure and is more typical of non-self-aligned metal gate IGFET processes in which the source and drain regions are provided prior to the gate electrodes. The process is described in U.S. Pat. No. 3,841,926 to Garnache et al and in U.S. Pat. No. 3,965,220 to Quinn et al, as well as in the IBM J. Res. Develop., May 1980, pp. 268–282. The buried barrier layer of the invention was ion implanted following the arsenic source-drain drive-in step, which is a major high temperature processing step performed near the beginning of the process before most of the major structural elements have been formed. In view of the remaining hot process steps following the ion implant and the final junction depth of about 0.8 microns, a minimum range of about 4Xj, or about 3.4 microns was preferred, although other ranges were also tried. Using an implantation energy of 2.6 MeV and a dose of 8E12 ions per square centimeter, boron was implanted into silicon wafers having a boron background concentration of 1.2E15/cc. The as-implanted boron concentration profile was determined to have a maximum concentration of 2E17/cc. Implanted wafers were returned to the processing line for the remainder of the process steps.

Completed devices were then examined at the end of the manufacturing process. The final boron concentration profile of the buried barrier was found to have spread to within about 2.5 microns of the surface while the maximum concentration was reduced to about 8.5E16Na/cc. No adverse device characteristics were found. Exposure of the completed devices to a standard alpha particle hot source during testing of the memory devices indicated that the soft error rate was reduced by about 40:1 compared to devices having no barrier. Subsequent extended exposure to environmental alpha particles indicated that a reduction in soft failures rates of in excess of 5:1 could be expected.

In summary, a method for effectively reducing the sensitivity of dynamic storage devices to environmentally caused radiation producing excess free carriers has been described. The method includes the basic steps of ion implanting a semiconductor substrate with impurity ions of the same type as present in the substrate to a projected range of 4 to 8 times the depth of diffused surface junctions such that a buried layer of enhanced impurity concentration is formed having a maximum concentration between 5E16 and 1E19 atoms/cc which is also one to three orders of magnitude greater than the concentration of impurity in the substrate. The process is implemented at a point in the process such that subsequent hot processing steps will not cause substantial diffusion of the implanted layer after ion implantation.

While the invention has been described in terms of specific embodiments, those skilled in the art will recognize that various changes can be made without deviating from the invention. For example, the implanted barrier of the invention can be implemented with other acceptor dopants in a p-type substrate or by using donor dopants in an n-type substrate.

Although the invention has been described in connection with processes in which a plurality of hot processing steps in excess of 500° C. are required, it is anticipated that the development of processes without hot processing steps is forthcoming. In such processes the point in the process at which the buried barrier is implanted will be less critical, although consideration of factors such as knock-on effects and ease of penetration of layers of material on the surface of the substrate will become more important.

Additional forms of surface penetrating radiation which cause the injection of large numbers of free carriers may also be protected against by determining the density of the generated excess free carriers and appropriately adjusting the density of dopant atoms in the barrier region. Unlike other methods, such as surface coatings and material purification, the present method reduces the effects of any cosmic rays or their secondary particles which in fact reach the substrate.

It will also be recognized by those skilled in the art, that the invention will provide the same beneficial effects for integrated circuits other than dynamic storage devices. For example, static logic and other circuit devices may also be subject to soft errors caused by transient radiation.

What is claimed is:

1. The method of manufacturing integrated circuit devices having a reduced susceptibility to radiation induced loss of charged data states in which a semiconductor substrate having a substantially uniform predetermined impurity concentration of a first conductivity type and having a predetermined thickness is sequentially exposed to a plurality of semiconductor processing steps which include at least two high temperature processing steps requiring processing temperatures in excess of about 500° C., one of which is used to form surface device p-n junction regions having a predetermined maximum depletion depth in a normal operating environment, characterized by the step of providing in a portion of the substrate a buried layer of increased first impurity concentration before the last of the high temperature processing steps so as to provide at the completion of all of the processing steps a buried non-degenerate impurity concentration profile having a maximum concentration of between $5 \times 10^{16}$ and $1 \times 10^{19}$ impurity atoms per cubic centimeter and being one to four orders of magnitude greater than the predetermined impurity concentration of the substrate and the buried layer being at a depth throughout its extent so as to be deeper than the regions of substantial electrical activity of devices formed on the surface of the substrate, whereby portions of the substrate above and below said buried layer remain at said predetermined impurity concentration.

2. The method of claim 1 wherein the buried layer is provided by ion implanting impurities of the first type into the substrate.

3. The method of claim 1 wherein the buried layer is provided after at least one of the high temperature processing steps.

4. The method of claim 2 wherein the projected range of the ion implanted impurity is greater than the maximum depletion depth associated with device structures formed on the surface of said substrate.

5. The method of claim 2 wherein the processing steps preceding the ion implantation step include the formation of a field oxide by the thermal oxidation of selected portions of the surface of the substrate.

6. The method of claim 2 wherein the processing steps preceding the ion implantation step include a p-n junction forming step.

7. The method of claim 1 wherein the impurity atoms initially present in the substrate and those of the buried region are the same chemical element.

8. The method of claim 7 wherein the semiconductor substrate is silicon and the impurity is boron.

9. The method of claim 8 wherein the boron used to form the buried layer is ion implanted into the substrate to provide a maximum concentration at a depth between four and eight times the depth of p-n junctions formed on the surface of the substrate.

10. The method of claim 9 wherein the energy at which boron is implanted is between one and five million electron volts.

11. The method of claim 10 wherein the energy at which boron is implanted is about 2.6 million electron volts at a dosage of about $8 \times 10^{12}$ ions per square centimeter.

* * * * *